United States Patent
Mejia et al.

(10) Patent No.: US 6,658,363 B2
(45) Date of Patent: Dec. 2, 2003

(54) DIGITAL DATA PATTERN DETECTION METHODS AND ARRANGEMENTS

(75) Inventors: Robert G Mejia, Tucson, AZ (US); Tammy T. Teuscher, Boise, ID (US); Stephen J. Elliott, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 123 days.

(21) Appl. No.: 09/766,903

(22) Filed: Jan. 18, 2001

(65) Prior Publication Data

US 2003/0009307 A1 Jan. 9, 2003

(51) Int. Cl.$^7$ .............................................. G06F 19/00
(52) U.S. Cl. ...................................................... 702/125
(58) Field of Search ......................... 702/125, 73, 66; 600/483; 341/138; 333/24; 324/121; 375/368

(56) References Cited

U.S. PATENT DOCUMENTS

| | | | |
|---|---|---|---|
| 3,949,299 A | * 4/1976 | Song ........................... | 341/138 |
| 4,811,366 A | 3/1989 | Kage | |
| 5,367,543 A | * 11/1994 | Uomoto ....................... | 375/368 |
| 5,974,104 A | 10/1999 | Dhara | |
| 5,978,742 A | * 11/1999 | Pickerd ........................ | 702/66 |
| 6,026,350 A | * 2/2000 | Tustin et al. .................. | 702/73 |
| 6,111,400 A | * 8/2000 | Foster et al. ............. | 324/121 R |
| 6,190,324 B1 | * 2/2001 | Kieval et al. ................ | 600/483 |
| 6,437,656 B1 | * 8/2002 | Guynn et al. .................. | 333/24 |

FOREIGN PATENT DOCUMENTS

| | | |
|---|---|---|
| EP | 0 740 161 | 10/1996 |
| EP | 1 139 103 | 10/2001 |
| EP | 1 156 339 | 11/2001 |
| JP | 01-305364 | 8/1989 |

OTHER PUBLICATIONS

Rowe, Martin "Triggers reel in waveform abnormalities oscilloscipes", Test and Measurement World, Vol 20, No. 10, Aug. 2000, 8 pages, http://www .tucker.com/Manufacturer/TMWorld/tmaug00_waveform.pdg.

Reiser, Ralph "Patter analyzer synchronizes scope in presence of jittery signal,", Computer Design, Vol 14, No. 7 , Jul. 1975, pp 106–108.

* cited by examiner

Primary Examiner—John Barlow
Assistant Examiner—Tung S Lau

(57) ABSTRACT

Pattern detection methods and arrangements are provided for monitoring a Fibre Channel, a Gigabit Ethernet, or other like data stream for programmable trigger patterns. Upon detecting a trigger pattern, the pattern detection methods and arrangements will assert an output. The output is useful for triggering oscilloscopes to be able to properly display the signal and more importantly, for arming time interval analyzers and other like test instruments. The pattern detection methods and arrangements are capable of dealing with elasticity in the data transmission channel. For example, the trigger pattern can be uniquely configured to a frame header or frame contents and the test instrument can be set to limit its sampling to within the frame bounds. In this manner all of the variability of fill transmission words appearing or disappearing essentially becomes transparent to the test instrument.

17 Claims, 3 Drawing Sheets

DIGITAL DATA PATTERN DETECTION METHODS AND ARRANGEMENTS

TECHNICAL FIELD

The present invention is related to digital signals, and more particularly to methods and arrangements for use in analyzing digital signals and patterns therein as shared between two or more systems, devices, and/or components.

BACKGROUND

Electrical, optical, and/or electromagnetic signals are used to convey information amongst various interfaced systems, devices, and components. To properly convey such information these interfaced "units" need to adhere to an agreed upon signaling format, such as, an existing communication standard. There are a number of standards available for implementation. Choosing one will depend upon the needs of the units being connected, etc.

There is a continuing drive towards higher speed digital interfaces, ones that can support the ever-expanding information age. Recently, for example, high-speed Fibre Channel and Gigabit Ethernet interfaces have become popular choices for implementation between various units. In these exemplary standards, the clock signal required to receive the information being transmitted is embedded within the serial digital data stream. Once the clock signal is recovered by the receiving unit, then the additional information included in the digital data stream can be recovered. Errors will occur if the recovered clock signal does not significantly match the original clock signal of the sending unit. Such errors can severely reduce the performance of a high-speed interface.

One of the problems associated with digital signaling is an effect known as "jitter". While technically speaking there are different types of jitter, jitter is often defined as the deviation from the ideal timing of an event. Thus, for example, jitter may cause an edge in a received digital signal to be altered in some fashion such that it is detected as occurring at an earlier or later time than it should be. For most interfaces, and especially high-speed digital interfaces, it is important to characterize and understand the amount/type of jitter affecting the digital data stream. Careful analysis of the jitter may lead to improvements in design, etc., of the interface and/or units.

Various test instruments are currently available for measuring and analyzing jitter. By way of example, the Wavechrest Corporation of Edina, Minn. produces several test sets that can be employed to characterize jitter in a digital interface.

For many interfaces, as is the case for high-speed Fibre Channel and Gigabit Ethernet interfaces, it is useful to generate specific test data streams that focus on certain jitter or other like degradation characteristics of the interface and/or units. In such a test arrangement, the receiving unit and/or connected testing device needs to know when to start and stop testing, recording and/or analyzing the received signal. This is often accomplished by an external arming signal, for example, from a signal generator. The arming signal may also be automated to synchronize to particular repeated signals.

It would be more useful, however, to have improved methods and arrangements that can be implemented to arm the testing device at a particular point in the data stream, because it has been found that the amount/type of jitter can vary depending upon the previous states of the interface. Thus, for example, if a digital data stream has been at a high binary level for several clock cycles, then a sudden change to a low binary level will typically occur later in time (i.e., resulting in more jitter) than would a more frequently alternating change between binary logic levels. Moreover, certain implemented data transmission channels introduce elasticity into the data stream that can cause problems for conventional test instrument arming techniques.

SUMMARY

The present invention provides improved methods and arrangements that can be implemented to arm a testing device or other like units at a particular point in a data stream.

For example, the above stated needs and others are met by a method that includes receiving a serial digital data stream having a trigger pattern immediately preceding a test pattern, determining if a selected portion of the digital data stream matches a pattern mask, the pattern mask being logically associated with the trigger pattern, and outputting an arming signal upon determining that a match exists between the selected portion of the digital data stream and the pattern mask.

In certain instances, the method may further include selectively converting portions of the serial data stream into corresponding parallel bit words and logically comparing one or more parallel bit words with the pattern mask. In certain implementations, the method includes interfacing with a data transmission channel, such as, for example, a data transmission channel that employs standards associated with either Fibre Channel or Gigabit Ethernet.

The method may also include generating the serial digital data stream and activating a test instrument with the arming signal. The method may be implemented in hardware, firmware, software, or any combination thereof.

The method may be implemented in a stand-alone device, one or more integrated circuits, programmable logic devices, computer programs, etc., and/or integrated within a test instrument or any other unit or appliance.

BRIEF DESCRIPTION OF THE DRAWINGS

A more complete understanding of the various methods and arrangements of the present invention may be had by reference to the following detailed description when taken in conjunction with the accompanying drawings wherein.

DETAILED DESCRIPTION

Figure 1:
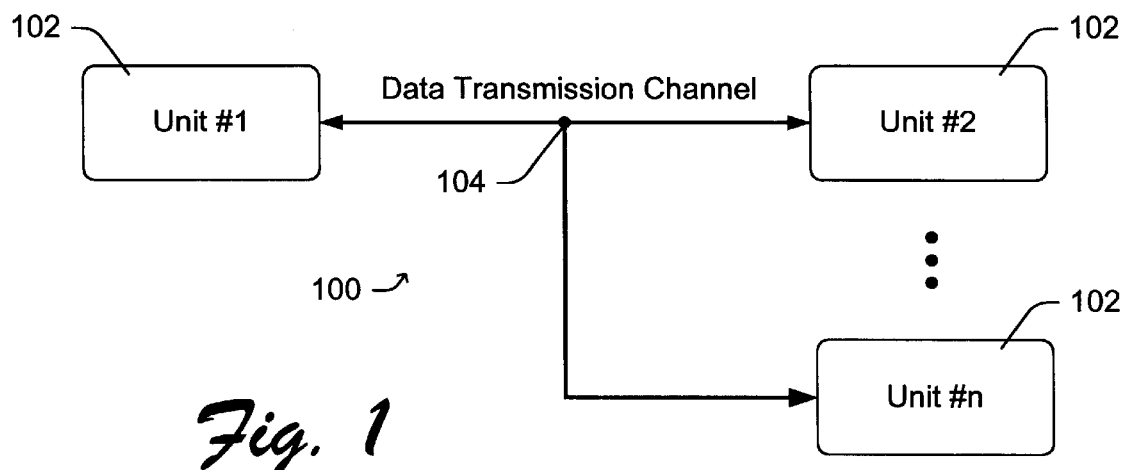
FIG. 1 is a block diagram depicting an exemplary digital signaling arrangement having a plurality of units that are operatively coupled together through a data transmission channel.

FIG. 1 depicts an exemplary digital signaling arrangement 100. Arrangement 100 broadly represents any type of configured group of systems, devices, and/or components that share information through digital signals. Thus, for example, arrangement 100 may include interconnected computers, peripherals, and the like. Arrangement 100 may include interconnected communication devices, such as, cellular radio devices, telephones, modems, etc. Arrangement 100 may also include an interconnecting local area network (LAN), wide area network (WAN), intranet, Internet, and the like.

To broadly depict these and other configurations, arrangement 100 is shown as having a plurality of units 102 that are operatively coupled together through at least one data transmission channel 104.

As applied herein, units 102 may include any type of systems, devices, and/or components that share information through digital signals. Thus, by way of example, in certain exemplary configurations unit #1 may include a computer and unit #2 may include a local or remote data storage device. In another configuration, unit #1 may include a microprocessor and unit #2 may include memory. In still other exemplary configurations unit #1 may include a mobile telephone device and unit #2 may include a mobile telephone switching device.

As shown in FIG. 1, data transmission channel 104 is configured to provide the interconnectivity between units 102 by carrying the digital data stream. Thus, for example, data transmission channel 104 may include electrically conductive interfaces, optically conductive interfaces, radio frequency (RF) interfaces, and the like.

In accordance with certain exemplary implementations of the present invention, data transmission channel 104 includes a Fibre Channel interface. Fibre Channel is a family of ANSI standards, see e.g., X.3230–1994- Fibre Channel Physical and Signaling Standard (FC-PH), ANSI. Fibre Channel essentially provides a common, efficient transport system supporting multiple protocols or raw data. Certain features of Fibre Channel configured arrangements are well known.

It should be kept in mind, however, that the various methods and arrangements described herein are not limited to Fibre Channel, but are applicable to a variety of digital signaling standards and arrangements.

Figure 2:
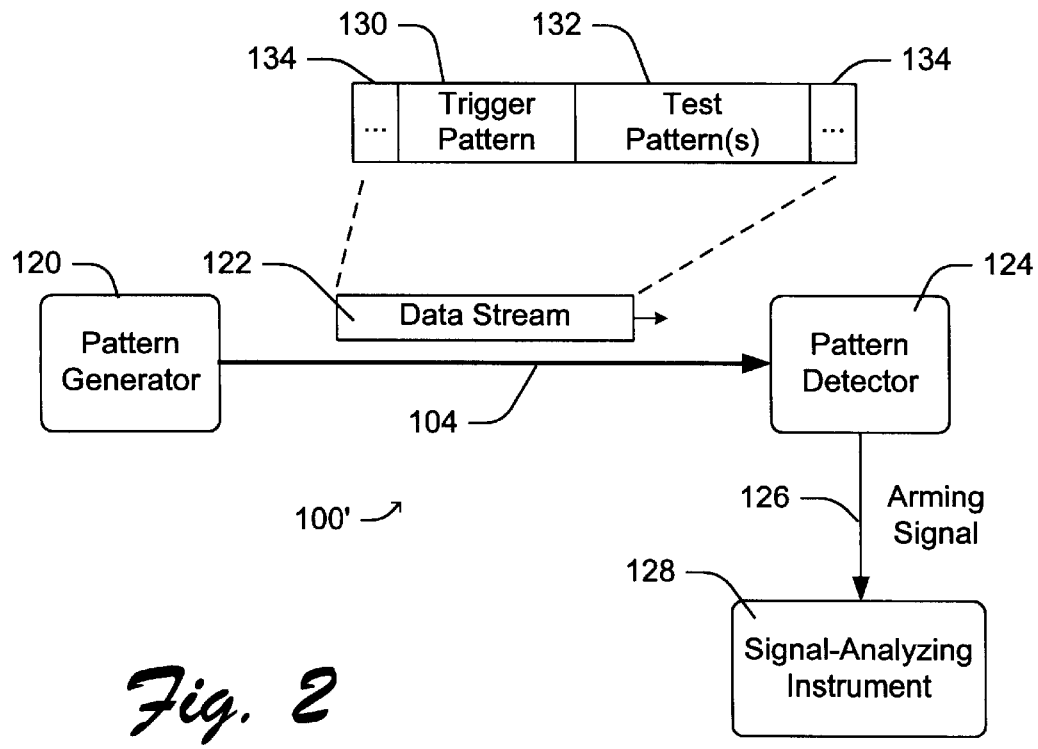
FIG. 2 is a block diagram depicting an exemplary testing arrangement for use in characterizing a data transmission channel, for example, as in FIG. 1, the exemplary testing arrangement includes a pattern detector.

With this in mind, reference is now made to FIG. 2, which depicts an exemplary testing arrangement 100' for use in characterizing all or part of data transmission channel 104. As shown, a pattern generator 120 or other like programmable signal generating mechanism is operatively configured to output a data stream 122 over data transmission channel 104 to a pattern detector 124. Pattern detector 124 is configured to selectively output an arming signal 126 or other like indicator to a signal-analyzing instrument 128. In this example, data stream 122 includes data in a specific trigger pattern 130 and data in a test pattern 132. Additional data 134, such as, for example, header and /or trailer information, may also be included as required.

Pattern detector 124 is configured to detect trigger pattern 130 and in response generate arming signal 126. In this manner, signal-analyzing instrument 128 can be controlled to access, record, analyze, or otherwise process data in test pattern 132 at the proper time.

As described in more detail below, pattern detector 124 can be implemented in hardware, firmware and/or software. Moreover, pattern detector 124 can be a stand-alone device, and/or integrated (e.g., see FIG. 1) into a unit 102 or a data transmission channel 104. Pattern detector may also be integrated into a signal analyzing instrument 128 as in FIG. 2, for example.

Those skilled in the art will be familiar with various well known, commercially-available, user-programmable digital data stream pattern generators and signal analyzing instruments, including special-purpose test equipment and general-purpose test equipment that can be employed in arrangement 100'. By way of example, Wavecrest Corporation produces several applicable models.

Figure 3:
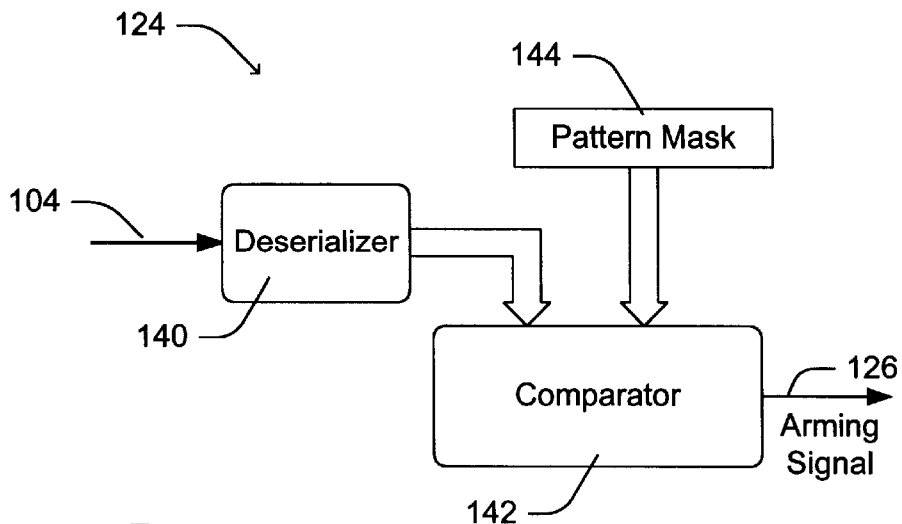
FIG. 3 is a block diagram depicting an exemplary pattern detector, for example, as in FIG. 2.

Attention is now drawn to the block diagram in FIG. 3. Here, an exemplary pattern detector 124 is shown as having a deserializer 140 that is operatively coupled to receive the digital data stream from data transmission channel 104. As its name suggests, deserializer 140 converts the incoming serial digital data bits into corresponding parallel bit words. As used herein, the number of bits in a parallel bit word can be any integer greater than one. Thus, for example, in a later example, the parallel bit word length is 10 bits. Techniques for converting serial data into parallel data are well known.

The resulting parallel bit word is provided to a comparator 142. As its name suggests, comparator 142 is configured to logically compare the parallel bit word with all or part of a programmable pattern mask 144. Thus, pattern mask 144 can specify any integer number of bits greater than one.

In certain implementations, pattern mask 144 is equal to an integer multiple of the parallel bit word. For example, in certain implementations pattern mask 144 is four times the length of the parallel bit word (e.g., 4×10 bits=40 bits). Preferably, the data in pattern mask 144 matches the data in trigger pattern 130 (see FIG. 2) and is used to time arming signal 126.

Essentially, comparator 142 is configured to compare one parallel bit word at a time to all or part of pattern mask 144 and to respond accordingly. Thus, if the mask length is equal to the parallel bit word length, then, upon identifying a logical match, comparator 142 will output arming signal 126.

If the mask length is greater than the parallel bit word length, then, upon identifying a logical match for a first parallel bit word, comparator 142 will sequentially compare each subsequently received parallel bit word with the corresponding bits in pattern mask 144. This comparison will continue until such time as there is either a completed match to pattern mask 144 for the plurality of sequentially received parallel bit words, or there is a mismatch in one or more bits. Arming signal 126 is output if there is a completed match. If there is a mismatch, then comparator 142 will start the process over again.

Figure 4:
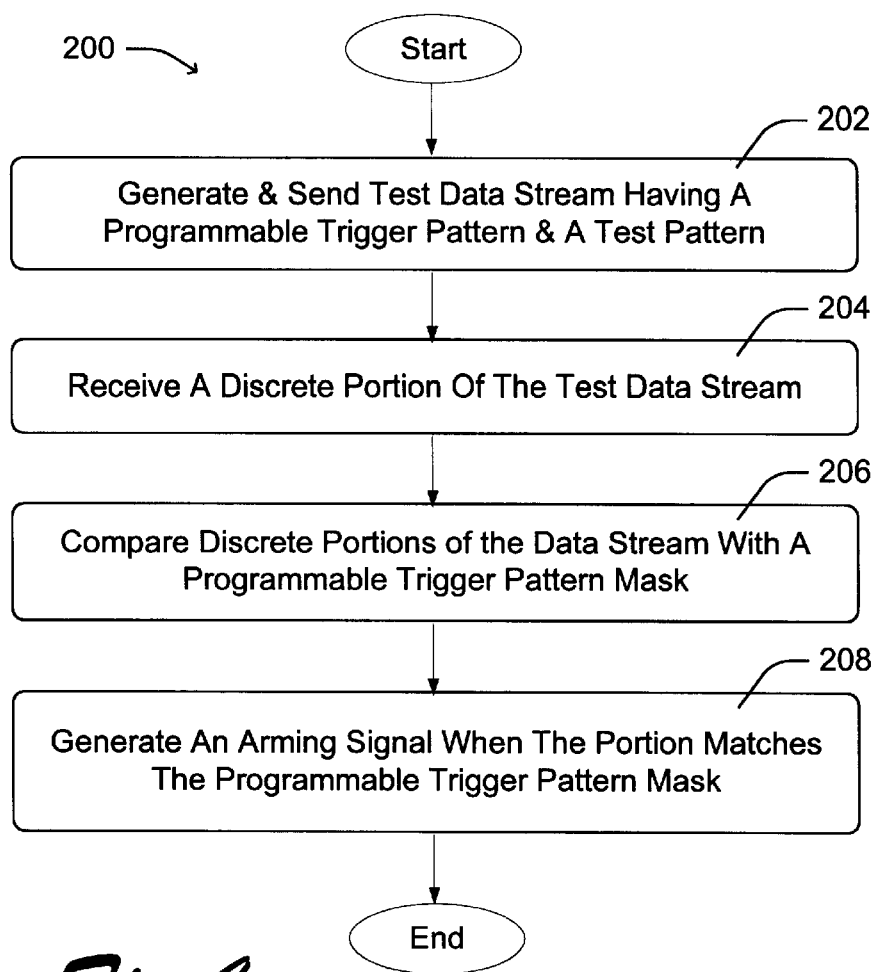
FIG. 4 is a flowchart depicting an exemplary process for use in a testing arrangement, for example, as in FIG. 2.

The flowchart in FIG. 4 provides an exemplary process 200 suitable for use in testing arrangement 100', as depicted FIG. 2. In step 202, a test data stream 122 having at least a programmable trigger pattern 130 and a test pattern 132 is generated and sent over data transmission channel 104. In step 204, a discrete portion of test data stream 122 is received. Next, in step 206, the discrete portion is selectively compared with at least a portion of a trigger pattern mask 144. Then in step 208, an arming signal 126 is generated when the discrete portion matches pattern mask 144.

Keeping in mind that above methods and arrangements may be implemented in hardware, firmware, software, or any combination thereof, a more detailed description of an exemplary hardware implementation for use with Fibre Channel or Gigabit Ethernet configurations is presented below.

Figure 5:
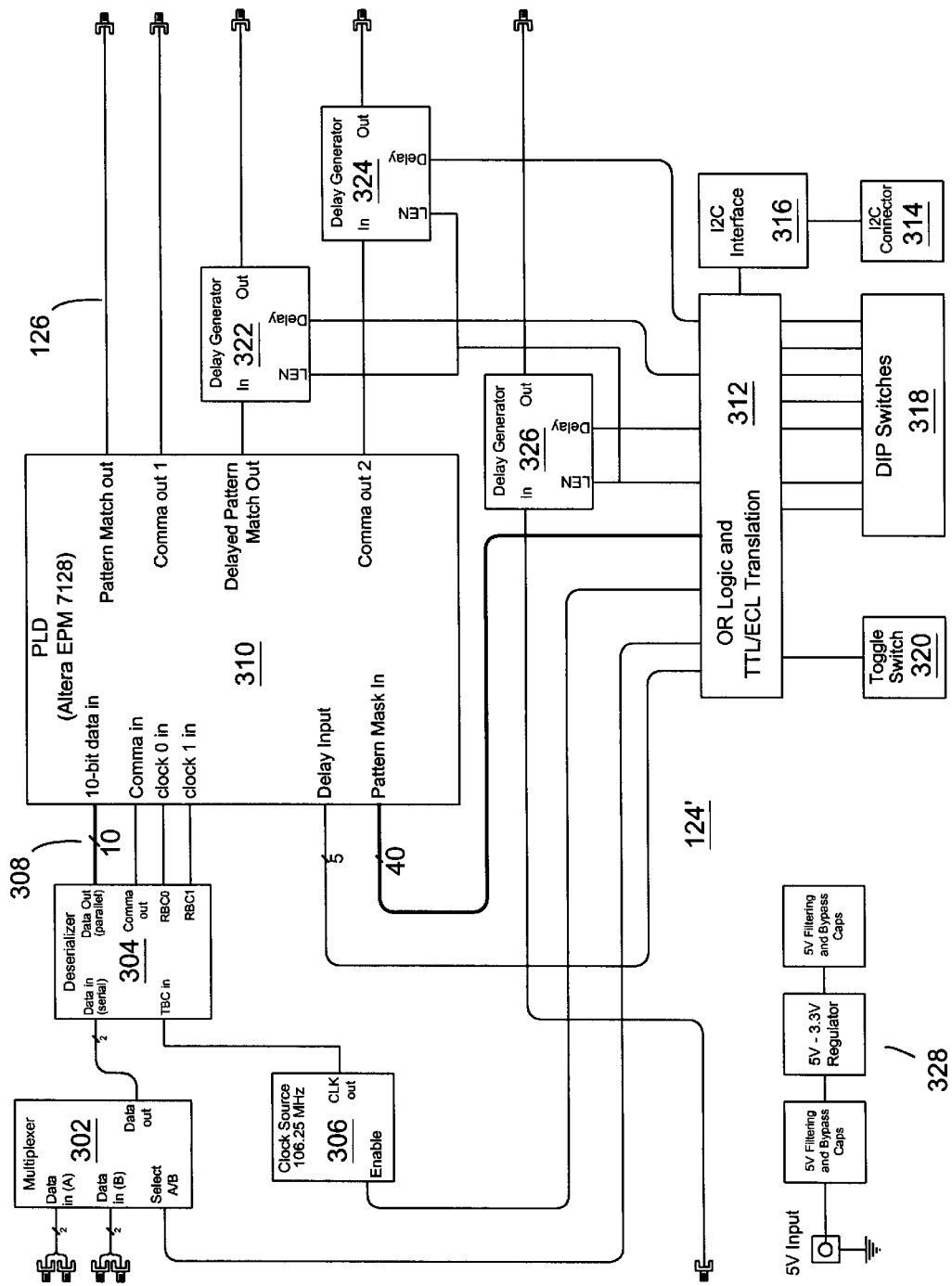
FIG. 5 is schematic drawing of an exemplary pattern detector circuit for use in a testing arrangement, for example, as in FIG. 2.

Attention is drawn to FIG. 5, which is a schematic drawing of an exemplary pattern detector circuit 124' suitable for use in testing arrangement 100', for example. Many of the circuit components shown in FIG. 5 are implementation specific and were added to provide certain additional conveniences during testing of the circuit in the laboratory. Consequently, many of the components or modules are optional.

With this in mind, pattern detector circuit 124' includes a multiplexer 302 operatively configured to connect to data transmission channel 104, a deserializer 304 connected to the output of multiplexer 302, a clock source 306 providing an input to deserializer 304, a parallel bus 308 connecting deserializer 304 to a programmable logic device (PLD) 310, and logic 312 providing inputs to PLD 310. As shown, logic 312 is coupled to receive inputs from another unit/program through a two-wire interface depicted here as including an I$^2$C (two-wire) connector 314 and interface 316. This connectivity capability may be considered optional. Logic 312 also receives inputs from one or more user-settable switches 318 and 320. Again, in certain implementations these may be considered optional. Logic 312 is not limited to logical operations but may also include memory (not shown).

Three additional/optional delay generators 322, 324 and 326 are also depicted. Delay generator 322 is coupled to receive control inputs from logic 312 and a pattern match out signal from PLD 310. Delay generator 324 is coupled to receive control inputs from logic 312 and a comma out #2 signal from PLD 310. Delay generator 326 is configurable to receive the digital data stream and introduce a delay thereto in response to inputs from logic 312.

In this example, pattern detector circuit 124' is configured to monitor a Fibre Channel data stream for a preset data trigger pattern 130 that is forty bits long (e.g., equal to one Fibre Channel transmission word). Upon detecting data trigger pattern 130, pattern detector circuit 124' will assert arming signal 126. As described above, the output of pattern detector circuit 124' can be used for triggering oscilloscopes to be able to more clearly display the signal and more importantly, for arming time interval analyzers.

One of the difficulties in viewing Fibre Channel data streams is that there is typically only the data signal and no clock. In order to use a scope or other signal-analyzing instrument 128, a Clock Recovery Unit (CRU) needs be applied to the data. Most commercially available bench-top CRUs will produce a clock, but will not produce a trigger signal that is synchronous with test pattern 132. Another complication of Fibre Channel signals is the presence of multiple clock domains and elasticity units that operate between the different domains. The frequencies of each domain are similar (+/−100 ppm) but typically not equal. In order to prevent overruns and underruns of bits at the clock domain boundaries, an elasticity function removes or adds bits from the data stream. The bits are added/removed in 40 bit words known as fill words. The fill words exist between frames that hold the "real" data in the system. The fill words are expendable and not missed by the ultimate recipient of the data.

Elasticity is a nuisance to conventional testing arrangements because the exact data stream that enters a Fibre Channel device is not the same one that comes out. Unfortunately, most test instruments expect the same test pattern back that it sent or otherwise checks to see that it is receiving a fixed pattern. Since fill words can come and go in an asynchronous manner, certain test instruments tend to declare all incoming bits as errors.

Pattern detector circuit 124' overcomes this elasticity problem. Here, for example, a search pattern can be set to something that is unique to a frame header or frame contents and the test gear can be set to limit its sampling to within the frame bounds. In this manner all of the variability of fill words appearing/disappearing becomes transparent to the test gear.

As described above and depicted in FIG. 5, there are multiple control signals in pattern detector circuit 124'. The control signals are controlled by setting the various switches 318 and 320 for bench top applications, and/or through I$^2$C (two-wire) connector and interface 314 and 316, respectively for use in computer automated test applications.

The input data stream enters through one of two input ports (A and B) of multiplexer 302, which in certain implementations accepts AC coupled ECL signals and has about 50 mV sensitivity. Multiplexer 302 selects one of the two input signals to be presented to deserializer 304. Multiplexer 302 is optional, especially considering that it may itself introduce additional jitter, etc.

Deserializer 304 extracts a clock signal from the data stream and runs it through a serial in/parallel out shift register (not shown). The data is presented at the deserializer output in 10-bit quarter words synchronized to a two-phase clock. Here, in this example, data is valid on the rising edge of either clock. Deserializer 304 also receives a clock input from clock source 306.

Deserializer 304 performs bit synchronization to a special quarter word that contains an exclusive pattern of bits known as a comma character. Upon reception of a comma character, the quarter word boundaries are established, the clock phases are reset and a comma output is toggled. The comma character is well known in Fibre Channel and has an equivalent in Gigabit Ethernet.

PLD 310 is configured to operatively accept the data and comma signals from deserializer 304. The comma output, now the comma input, is used within PLD 310 to synchronize the internal logic to establish word boundaries. In this example, all internal data comparisons are made on single and complete words.

If the word input to PLD 310 is the same as a mask pattern 144 (see, e.g., FIG. 3) presented to PLD 310 at the pattern mask input, then a pulse signal will be output via the pattern match output. In certain exemplary implementations, there is about a 97 nS delay between the start of the word at the serial input and the assertion of the output.

As further depicted in this example, an additional delayed pattern match output will pulse after waiting a number of clocks as indicated at the delay input of PLD 310 as defined by logic 312.

There are also two comma outputs (I.e., comma out 1 and comma out 2) that merely repeat the comma input without applying any logic or filtering to the signal. As described above, selected outputs are delayed by delay generators 322, 324 and 326, which are digital ECL delay lines providing about a 2.5 nS delay range in increments of about 20 pS in accordance with certain implementations of the present invention.

Exemplary code for implementing PLD 310 is included below. The code comments provide a detailed description of the logic inside the PLD. The code itself, of course, provides an exact description for this exemplary implementation.

```
TITLE "pattern_detector";
-- This code implements a circuit that checks for specific 40 bit strings in the output
-- of 10-bit SERDES. The circuit interfaces with the parallel output of the SERDES
-- and with 40 bit lines that indicate the pattern match mask. When the SERDES receives
-- 40 bits that match the compare mask, the PAT_XXX output will toggle.
-- The circuit synchronizes itself to the comma detect output of the SERDES. The 40 bit
-- mask is applied on a 40 bit word by 40 bit word basis against the incoming data. The
-- 40 bit compare windows are started at the reception of a comma character, the comma
-- character and the remaining 30 bits are compared against the mask. The 40 bits that
-- follow after that are compared to the mask, and so on. The circuit will re-synchronize
-- to any incoming comma character.
-- Patterns not aligned to commas will NOT be detected. However, patterns not containing
-- commas can be detected provided they occur on even 40 bit increments from the last
-- comma that was detected.
SUBDESIGN pattern_detector
(
    10BITIN[9..0]          : INPUT;         -- 10 bit input, connector to 10 bit output of
    SERDES
    PATTERN_0_[9..0]  : INPUT;         -- First 10 bits of the match pattern mask
    PATTERN_1_[9..0]  : INPUT;         -- more match pattern
    PATTERN_2_[9..0]  : INPUT;         -- more match pattern
    PATTERN_3_[9..0]  : INPUT;         -- Last 10 bits of the match pattern mask
    DELAY_[4..0]           : INPUT;         -- Delay, each bit set causes 10-bits of delay on
    PAT_OUT output.
                           -- Setting more than one of these will stretch the output pulse going
                           -- to the PAT_OUT. The PAT_SMA output is not affected by
    DELAY_[4..0].
    CLK0                   : INPUT;         -- Clock 180 degree phase
    CLK1                   : INPUT;         -- Clock 0 degree phase (clk1 clocks comma
    characters)
    COMDET                 : INPUT;         -- Comma detect input, connects to comm detect
    out on SERDES
    PAT_OUT                : OUTPUT;        -- Pattern matched output
    COMMA_OUT              : OUTPUT;        -- COMDET input
    PAT_SMA                : OUTPUT;        -- 2nd pattern matched output for SMA connection
    COMMA_OUT_SMA          : OUTPUT;        -- 2nd COMDET input for SMA connection
)
-- Variable Section (optional)
VARIABLE
    COMDET_D0         :                DFF; -- buffered comma detect
    10BIT_BUF0_[9..0] :           DFF; -- Input buffer for 10-bit data on clk0
    10BIT_BUF1_[9..0] :           DFF; -- Input buffer for 10-bit data on clk1
    SYNC0             :           DFF; -- Quadrature counter used for steering incoming data
    SYNC1             :           DFF; -- to the appropriate comparasin logic.
    PAT_0             :           DFF; -- Variable indicating 1st 10-bits match mask
    PAT_1             :           DFF; -- Variable indicating 2nd 10-bits match mask
    PAT_2             :           DFF; -- Variable indicating 3rd 10-bits match mask
    PAT_3             :           DFF; -- Variable indicating last 10-bits match mask
    PAT_0_D0          :           DFF; -- Delayed version of matched first 10-bits variable
    PAT_0_D1          :           DFF; -- Delayed delayed version of "matched first 10-bits" variable
    PAT_1_D0          :           DFF; -- Delayed version of "matched second 10-bits" variable
    PAT_2_D0          :           DFF; -- Delayed version of "matched third 10-bits" variable
    PAT               :                DFF; -- Varible indicating that all 40 bits were matched
    PAT_D0            :           DFF; -- Variable to delay the pattern detect output
    PAT_D1            :           DFF; -- Variable to delay the pattern detect output
    PAT_D2            :           DFF; -- Variable to delay the pattern detect output
    PAT_D3            :           DFF; -- Variable to delay the pattern detect output
-- Logic Section
BEGIN
    10BIT_BUF0_[9..0].d   = 10BITIN[9..0]; -- Latch data aligned to CLK0
    10BIT_BUF0_[9..0].clk        = CLK0;
    10BIT_BUF1_[9..0].d   = 10BITIN[9..0]; -- Latch data aligned to CLK1
    10BIT_BUF1_[9..0].clk        = CLK1;
    COMDET_D0.d                  = COMDET; -- Latch Comma detect input, this generates a delayed
    COMDET_D0.clk         = CLK1; -- version of cama detect used for setting the phase of the SYNC0
    variable.
    SYNC0.clk             = CLK0; -- Equations for SYNC0 quadrature variable, sync to
    SYNC0.d               = !SYNC0 # COMDET_D0; -- Delayed Comma detect and then toggle
    SYNC1.clk             = CLK1; -- Equations for SYNC1 quadrature variable, sync to
    SYNC1.d               = !SYNC1 # COMDET; -- Comma detect and then toggle.
-- The code below makes the comparisons between the output of the input data buffer outputs
-- and the pattern masks. On the rising edge of each clock 2 comparisons are made. The
-- proper mask is selected based on the state of the SYNC0 and SYNC1 quadrature signals.
    PAT_0.d               = 10BIT_BUF1_[9..0] == PATTERN_0_[9..0] & SYNC1;
    PAT_0.clk             = CLK1;
    PAT_1.d               = 10BIT_BUF0_[9..0] == PATTERN_1_[9..0] & SYNC0;
    PAT_1.clk             = CLK0;
    PAT_2.d               = 10BIT_BUF1_[9..0] == PATTERN_2_[9..0] & !SYNC1;
    PAT_2.clk             = CLK1;
```

-continued

```
    PAT_3.d            = 10BIT_BUF0_[9..0] == PATTERN_3_[9..0] & !SYNC0;
    PAT_3.clk          = CLK0;
-- The code in the next segment stores the intermediate values until the end of a 40 bit
-- sequenc when all of the data is available to make the determination that all 40 bits
-- match.
    PAT_0_D0.d = PAT_0;
    PAT_0_D0.clk           = CLK1;
    PAT_0_D1.d = PAT_0_D0;
    PAT_0_D1.clk           = CLK0;
    PAT_1_D0.d = PAT_1;
    PAT_1_D0.clk           = CLK0;
    PAT_2_D0.d = PAT_2;
    PAT_2_D0.clk           = CLK0;
-- This bit here checks for a match of all 4 of the 10-bit segments.
    PAT.d              = PAT_0_D1 & PAT_1_D0 & PAT_2_D0 & PAT_3;
    PAT.clk            = CLK0;
    PAT_SMA            = PAT; -- This is the pattern detect output.
-- This applies the delay function to the PAT_OUT output.
-- Each variable, e.g. PAT_Dx is one clock (9.41 nS) later than the other.
    PAT_D0.d           =         PAT;
    PAT_D0.clk         =         CLK1;
    PAT_D1.d           =         PAT_D0;
    PAT_D1.clk         =         CLK0;
    PAT_D2.d           =         PAT_D1;
    PAT_D2.clk         =         CLK1;
    PAT_D3.d           =         PAT_D2;
    PAT_D3.clk         =         CLK0;
-- The next statement picks the delay variable to be output based on which of the delay enables is
    asserted
    PAT_OUT            =         (PAT & DELAY_0) # (PAT_D0 & DELAY_1) # (PAT_D1 &DELAY_2)
    #
                                 (PAT_D2 & DELAY_3) # (PAT_D3 & DELAY_4);
    COMMA_OUT                    =       COMDET;
    COMMA_OUT_SMA                =       COMDET;
    END;
```

Additional details for the implementation shown in FIG. 5 include the following table defining the two-wire interface, search or pattern mask, and the various other delay and controlling inputs associated with logic 312.

In the control mechanism column, the designations E0 and E1 refer to the two 12C expanders on the board.

| Variable | Control mechanism | Range/Levels |
|---|---|---|
| Search Pattern | I2C E0-P0-B[7...0]<br>I2C E0-P1-B[7...0]<br>I2C E0-P2-B[7...0]<br>I2C E0-P3-B[7...0]<br>I2C E0-P4-B[7...0]<br>P0-B1 is the first bit of the sequence and P4-B7 is the 40th | 1 - Match a 1 in the data<br>0 - Match a 0 in the data |
| REFCLK Enable | I2C E1-P2-B0 | 1 - REFCLK Enabled<br>0 - REFCLK Disabled |
| Input Select | I2C E1-P1-B7 | 1 - Input #2 Enabled<br>0 - Input #1 Enabled |
| Coarse Delay Adjust, Pattern Match Output | I2C E1-P2-B[6...2] | 1 - Delay Enabled<br>0 - Delay Disabled<br>If a bit is enabled, the pulse with the delay associated with that bit is enabled. If multiple bits are selected multiple pulses will be output. Adjacent bits being selected may result in slivers. A good rule is to enable only one of these bits at a time. Each pulse is offset by 10 bits from the previous and is 10 bits long. |
| Fine Delay Adjust Pattern Match Output | I2C E1-P0-B[0...6] | 1 - Enable Delay<br>0 - Disable Delay |
| Fine Delay Adjust, Comma Output | I2C E1-P3-B[0...6] | Bits are binary weighted with the LSB about 20 pS |
| Fine Delay Adjust Auxiliary Channel | I2C E1-P4-B[0...6] | |
| Fine Delay Adjust Latch Enable for fine adjust settings | I2C E1-P0-B7 | 1 - Latched<br>0 - Transparent<br>Recommend that this be set to 0 for transparent operation since there are latches available in the I2C expanders |

Similar control inputs may be provided through one or more manual switches or the like, such as, e.g. DIP switches 318. Toggle switch 320 was added to this exemplary circuit to adjust the phase of the clock output from clock source 306 to deserializer 304 (e.g., a SERDES in the code above). The delay generators 322, 324 and 326 were added to provide for additional fine resolution adjustment to the set-up and hold time used to line-up signal analyzing instrument 128.

Also depicted in FIG. 5 is a power supply 328 that is implemented to provide the requisite power to the various components in pattern detector 124'.

Although some preferred embodiments of the various methods and arrangements of the present invention have been illustrated in the accompanying Drawings and described in the foregoing Detailed Description, it will be understood that the invention is not limited to the exemplary embodiments disclosed, but is capable of numerous rearrangements, modifications and substitutions without departing from the spirit of the invention as set forth and defined by the following claims.

What is claimed is:

1. A method comprising:
   receiving a serial digital data stream using a Fibre Channel interface, the digital data stream having a trigger pattern immediately preceding a test pattern;
   extracting a clock signal from the digital data stream;
   deserializing the digital data stream based on the extracted clock signal;
   determining if a selected portion of the deserialized digital data stream matches a pattern mask, the pattern mask being logically associated with the trigger pattern; and
   outputting an arming signal upon determining that match exists between the selected portion of the deserialized digital data stream and the pattern mask.

2. The method as recited in claim 1, wherein deserializing the serial digital data stream further includes:
   selectively converting portions of the serial data stream into corresponding parallel bit words.

3. The method as recited in claim 2, wherein determining if the selected portion of the deserialized digital data stream matches the pattern mask further includes:
   logically comparing one or more parallel bit words with the pattern mask.

4. The method as recited in claim 1, wherein extracting the clock signal from the digital data stream includes performing bit synchronization based on at least one identified comma character encoded within the digital data stream.

5. The method as recited in claim 1, further comprising generating the serial digital data stream.

6. The method as recited in claim 1, further comprising activating a test instrument with the arming signal.

7. A computer-readable medium having computer-executable instructions for performing steps comprising:
   receiving a serial digital data stream using a Fibre Channel interface, the digital data stream having a trigger pattern immediately preceding a test pattern;
   extracting a clock signal from the digital data stream;
   deserializing the digital data stream based on the extracted clock signal;
   determining if a selected portion of the deserialized digital data stream matches a pattern mask, the pattern mask being logically associated with the trigger pattern; and
   outputting an arming signal upon determining that match exists between the selected portion of the deserialized digital data stream and the pattern mask.

8. The computer-readable medium as recited in claim 7, wherein deserializing the serial digital data stream further includes:
   selectively converting portions of the serial data stream into corresponding parallel bit words.

9. The computer-readable medium as recited in claim 8, wherein determining if the selected portion of the deserialized digital data stream matches the pattern mask further includes:
   logically comparing one or more parallel bit words with the pattern mask.

10. The computer-readable medium as recited in claim 7, wherein extracting the clock signal from the digital data stream include performing bit synchronization based on at least one identified comma character encoded within the digital data stream.

11. An arrangement comprising:
   a deserializer configured to receive a serial digital data stream using a Fibre Channel interface, the digital data stream having trigger pattern immediately preceding a test pattern, extract a clock signal from the digital data stream, and deserialize the digital data stream based on the extracted clock signal; and
   logic operatively coupled to the deserializer and configured to:
      determine if a selected portion of the deserialized digital data stream as output by the deserializer matches a pattern ask, the pattern mask being logically associated with the trigger pattern; and
      output an arming signal upon determining that a match exists between the selected portion of the deserialized digital data stream and the pattern mask.

12. The arrangement as recited in claim 11, wherein the deserializer is further configured to selectively convert portions of the serial data stream into corresponding parallel bit words.

13. The arrangement as recited in claim 12, wherein the logic is further configured to logically compare one or more parallel bit words with the pattern mask.

14. The arrangement as recited in claim 12, wherein he deserializer extracts the clock signal from the digital data stream by performing bit synchronization based on at least one identified comma character encoded within the digital data stream.

15. The arrangement as recited in claim 11, further comprising a control interface operatively coupled to the logic and configured to define the pattern mask in response to at least one externally generated signal.

16. The arrangement as recited in claim 11, further comprising a control interface operatively coupled to the logic and configured to define the pattern mask in response to a user input mechanism.

17. The arrangement as recited in claim 11, further comprising a test instrument operatively coupled to the logic and responsive to the arming signal.

* * * * *